(12) United States Patent
Louie et al.

(10) Patent No.: US 7,887,146 B1
(45) Date of Patent: Feb. 15, 2011

(54) SUSPENDED STORAGE SYSTEM FOR PHARMACY

(75) Inventors: Shelton Louie, Vancouver, WA (US); Stephen A. Garrett, Vancouver, WA (US)

(73) Assignee: GSL Solutions, Inc., Vancouver, WA (US)

( * ) Notice: Subject to any disclaimer, the term of this patent is extended or adjusted under 35 U.S.C. 154(b) by 0 days.

(21) Appl. No.: 10/223,308

(22) Filed: Aug. 18, 2002

Related U.S. Application Data

(60) Provisional application No. 60/313,305, filed on Aug. 18, 2001.

(51) Int. Cl.
*B01L 9/02* (2006.01)
(52) U.S. Cl. .................. 312/209; 312/128; 312/234.1; 211/85.15
(58) Field of Classification Search ............... 312/117, 312/248, 211, 351, 209, 23, 128, 234.1; 211/85.15; 248/339, 440
See application file for complete search history.

(56) References Cited

U.S. PATENT DOCUMENTS

| | | | |
|---|---|---|---|
| 404,458 A | 6/1889 | Woodruff | |
| 541,111 A * | 6/1895 | McDonald | .................. 217/10 |
| 827,649 A | 7/1906 | Murphy | |
| 1,236,324 A | 8/1917 | Leonard | |
| 1,592,497 A | 7/1926 | Mays | |
| 1,750,291 A | 3/1930 | Whetstone | |
| 1,993,477 A | 3/1935 | Glenn et al. | |
| 2,174,068 A | 9/1939 | Citron | |
| 2,962,335 A * | 11/1960 | Benson | .................. 312/184 |
| 3,167,873 A | 2/1965 | Toms | |
| 3,172,711 A * | 3/1965 | Gillotte | .................. 312/184 |
| 3,744,867 A | 7/1973 | Shaw | |
| 3,798,810 A * | 3/1974 | Brisson et al. | .................. 40/375 |
| 3,844,416 A * | 10/1974 | Potter | .................. 211/162 |
| 3,865,447 A | 2/1975 | Patterson | |
| 3,942,851 A | 3/1976 | Kaplan | |
| 3,970,010 A | 7/1976 | Cantley | |
| 4,210,802 A | 7/1980 | Sakai | |

(Continued)

FOREIGN PATENT DOCUMENTS

EP      0 899 677      3/1999

(Continued)

OTHER PUBLICATIONS

White, Ron, How Computers Work, Millenium Ed., Que Corporation, Sep. 22, 1999.

(Continued)

*Primary Examiner*—Hanh V Tran
(74) *Attorney, Agent, or Firm*—Harness, Dickey & Pierce, P.L.C.

(57) ABSTRACT

A storage system for a pharmacy that has a frame containing a rack-like structure with a plurality of storage carriers detachably suspended therefrom. The carriers are sized to receive filled prescription orders and the like and include individual identifiers that facilitate locating the carriers at a specific location on the rack-like structure. Preferably, the storage system includes a tracking system that detects, monitors, and displays to a worker the location of the storage carrier containing a particular customer's prescription order, thereby providing easy retrieval of the customer's prescription order.

27 Claims, 5 Drawing Sheets

U.S. PATENT DOCUMENTS

| | | | |
|---|---|---|---|
| 4,653,818 | A | 3/1987 | DeBruyn |
| 4,688,026 | A | 8/1987 | Scribner et al. |
| 4,737,910 | A | 4/1988 | Kimbrow |
| 4,746,830 | A * | 5/1988 | Holland ............. 310/313 D |
| 4,766,542 | A | 8/1988 | Pilarczyk |
| 4,793,495 | A * | 12/1988 | Preu ................. 211/13.1 |
| 4,993,558 | A | 2/1991 | Assael |
| 5,047,948 | A * | 9/1991 | Turner ................. 700/237 |
| 5,079,006 | A | 1/1992 | Urquhart |
| 5,160,048 | A * | 11/1992 | Leyden et al. ................ 211/7 |
| 5,208,762 | A | 5/1993 | Charhut et al. |
| 5,231,273 | A | 7/1993 | Caswell et al. |
| 5,245,163 | A | 9/1993 | Bar-Yehuda |
| 5,328,784 | A | 7/1994 | Fukuda |
| 5,346,297 | A | 9/1994 | Colson et al. |
| 5,389,919 | A | 2/1995 | Warren et al. |
| 5,434,775 | A | 7/1995 | Sims et al. |
| 5,481,546 | A | 1/1996 | Dinkins |
| 5,495,250 | A | 2/1996 | Ghaem et al. |
| 5,593,267 | A | 1/1997 | McDonald et al. |
| 5,595,356 | A | 1/1997 | Kewin |
| 5,597,995 | A | 1/1997 | Williams et al. |
| 5,640,002 | A | 6/1997 | Ruppert et al. |
| 5,646,389 | A | 7/1997 | Bravman et al. |
| 5,646,592 | A | 7/1997 | Tuttle |
| 5,689,238 | A | 11/1997 | Cannon et al. |
| 5,700,998 | A | 12/1997 | Palti |
| 5,771,657 | A | 6/1998 | Lasher et al. |
| 5,794,213 | A | 8/1998 | Markman |
| 5,797,515 | A * | 8/1998 | Liff et al. ................. 221/2 |
| 5,798,693 | A | 8/1998 | Engellenner |
| 5,805,456 | A | 9/1998 | Higham et al. |
| 5,838,253 | A | 11/1998 | Wurz et al. |
| 5,845,264 | A | 12/1998 | Nellhaus |
| 5,907,493 | A | 5/1999 | Boyer et al. |
| 5,926,093 | A | 7/1999 | Bowers et al. |
| 5,936,527 | A | 8/1999 | Isaacman et al. |
| 5,963,132 | A | 10/1999 | Yoakum |
| 5,974,393 | A | 10/1999 | McCullough et al. |
| 5,996,889 | A | 12/1999 | Fuchs et al. |
| 6,008,727 | A | 12/1999 | Want et al. |
| 6,021,392 | A | 2/2000 | Lester et al. |
| 6,057,756 | A | 5/2000 | Engellenner |
| 6,057,764 | A | 5/2000 | Williams |
| 6,098,892 | A | 8/2000 | Peoples |
| 6,116,505 | A | 9/2000 | Withrow |
| 6,150,942 | A | 11/2000 | O'Brien |
| 6,170,746 | B1 | 1/2001 | Brook et al. |
| 6,202,923 | B1 | 3/2001 | Boyer et al. |
| 6,209,978 | B1 | 4/2001 | Khan |
| 6,219,587 | B1 | 4/2001 | Ahlin et al. |
| 6,223,137 | B1 | 4/2001 | McCay et al. |
| 6,232,876 | B1 | 5/2001 | Maloney |
| 6,245,057 | B1 | 6/2001 | Sieben et al. |
| 6,249,212 | B1 | 6/2001 | Boyer et al. |
| 6,259,654 | B1 | 7/2001 | de la Huerga |
| 6,294,999 | B1 | 9/2001 | Yarin et al. |
| 6,318,536 | B1 | 11/2001 | Korman et al. |
| 6,324,522 | B2 | 11/2001 | Peterson et al. |
| 6,339,732 | B1 | 1/2002 | Phoon et al. |
| 6,354,493 | B1 | 3/2002 | Mon |
| 6,357,662 | B1 | 3/2002 | Helton et al. |
| 6,366,206 | B1 | 4/2002 | Ishikawa et al. |
| 6,366,220 | B1 | 4/2002 | Elliott |
| 6,380,858 | B1 | 4/2002 | Yarin et al. |
| 6,392,544 | B1 | 5/2002 | Collins et al. |
| 6,415,295 | B1 | 7/2002 | Feinberg |
| 6,415,978 | B1 | 7/2002 | McAllister |
| 6,430,268 | B1 | 8/2002 | Petite |
| 6,440,069 | B1 | 8/2002 | Raymond et al. |
| 6,448,886 | B2 | 9/2002 | Garber et al. |
| 6,450,406 | B2 | 9/2002 | Brown |
| 6,464,142 | B1 | 10/2002 | Denenberg et al. |
| 6,496,806 | B1 | 12/2002 | Horwitz et al. |
| 6,502,005 | B1 | 12/2002 | Wrubel et al. |
| 6,522,945 | B2 | 2/2003 | Sleep et al. |
| 6,529,786 | B1 | 3/2003 | Sim |
| 6,557,758 | B1 | 5/2003 | Monico |
| 6,564,121 | B1 | 5/2003 | Wallace et al. |
| 6,611,806 | B1 | 8/2003 | Harvey |
| 6,648,153 | B2 * | 11/2003 | Holmes ................. 211/85.15 |
| 6,714,121 | B1 | 3/2004 | Moore |
| 6,758,403 | B1 | 7/2004 | Keys et al. |
| 6,763,996 | B2 | 7/2004 | Rakers et al. |
| 6,769,228 | B1 | 8/2004 | Mahar |
| 6,877,658 | B2 | 4/2005 | Raistrick et al. |
| 6,935,560 | B2 | 8/2005 | Andreasson et al. |
| 6,995,675 | B2 | 2/2006 | Curkendall et al. |
| 7,142,118 | B2 | 11/2006 | Hamilton et al. |
| 7,148,803 | B2 | 12/2006 | Bandy et al. |
| 7,158,030 | B2 | 1/2007 | Chung |
| 7,175,081 | B2 | 2/2007 | Andreasson et al. |
| 7,289,015 | B2 | 10/2007 | Moyer |
| 7,382,263 | B2 | 6/2008 | Danowski et al. |
| 2001/0017817 | A1 | 8/2001 | de la Huerga |
| 2001/0040512 | A1 | 11/2001 | Hines et al. |
| 2002/0132226 | A1 | 9/2002 | Nair et al. |
| 2002/0180588 | A1 | 12/2002 | Erickson et al. |
| 2003/0086338 | A1 | 5/2003 | Sastry et al. |
| 2003/0191430 | A1 | 10/2003 | D'Andrea et al. |
| 2003/0200726 | A1 | 10/2003 | Rast |
| 2004/0036623 | A1 | 2/2004 | Chung |
| 2005/0237201 | A1 | 10/2005 | Nedblake |
| 2006/0190628 | A1 | 8/2006 | Linton et al. |

FOREIGN PATENT DOCUMENTS

| | | | |
|---|---|---|---|
| EP | | 1 049 042 | 11/2000 |

OTHER PUBLICATIONS

Derfler, Frank J. et al., How Networks Work, Millenium Ed., Que Corporation, Aug. 23, 2000.

Gralla, Preston, How the Internet Works, Millenium Ed., Que Corporation, Sep. 23, 1999.

* cited by examiner

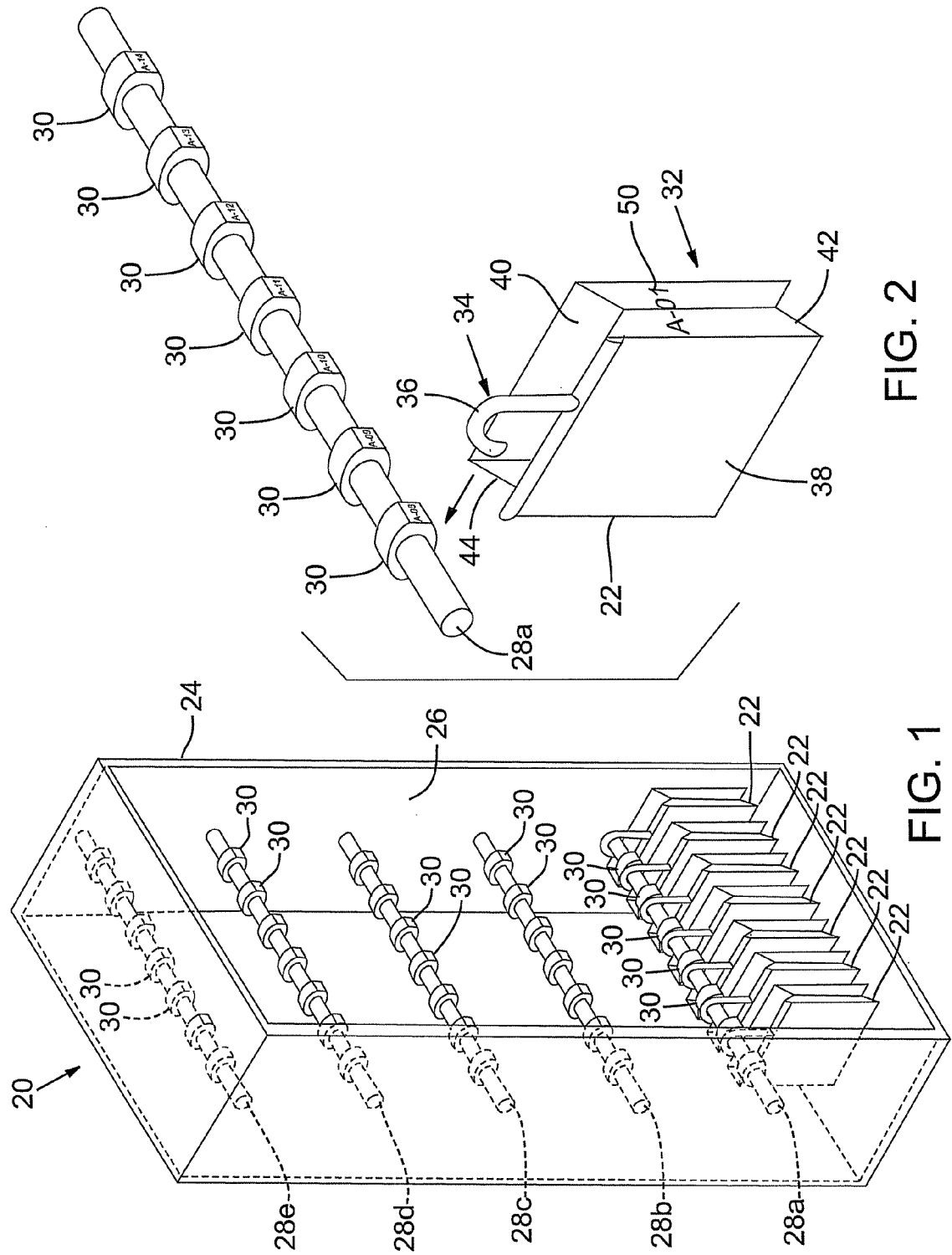

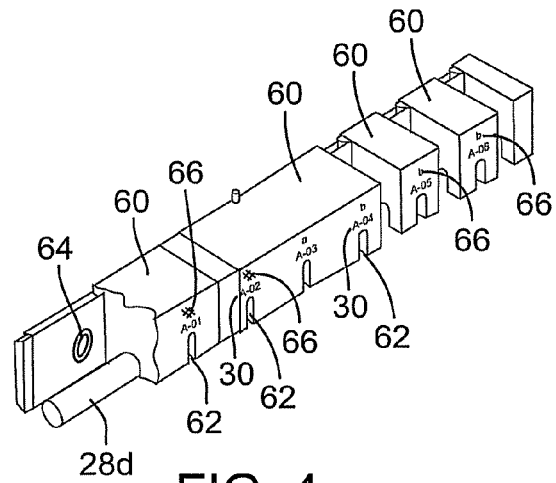
FIG. 4
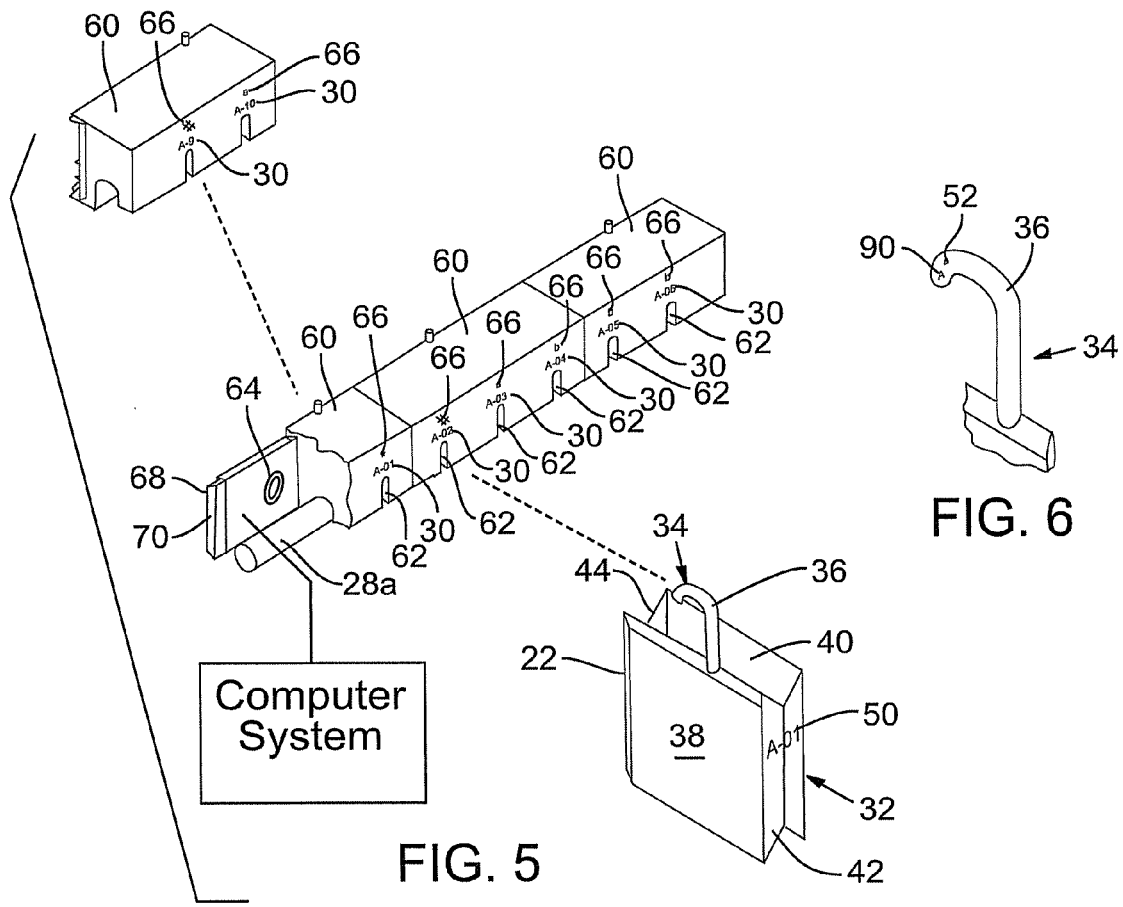
FIG. 5
FIG. 6

SUSPENDED STORAGE SYSTEM FOR PHARMACY

REFERENCE TO RELATED APPLICATIONS

This application claims priority to U.S. provisional patent application Ser. No. 60/313,305 filed on Aug. 18, 2001.

FIELD OF THE INVENTION

The present invention relates to a cost-effective and space-saving device and system for storing and retrieving prescription orders for customer pickup and the like. In particular, it includes a frame having a rack-like structure with a plurality of carriers detachably suspended therefrom. The carriers are sized to receive filled prescription orders and the like and include identifiers that facilitate locating the carriers at a specific location on the rack-like structure.

BACKGROUND OF THE INVENTION

A typical local retail pharmacy fills thousands of prescription orders per week. Moreover, as the general population ages and new beneficial drugs are introduced, prescription order volumes to be filled at retail pharmacies are expected to double within the next few years. This present and expected increase in order volume places enormous pressure on pharmacists and other pharmacy workers, who strive to fill each order efficiently, accurately and quickly.

Retail pharmacies typically maintain a will-call area that contains filled prescription orders waiting for customer pickup. As the volume of prescription orders filled at a typical retail pharmacies increases, the amount of physical storage needed to hold these filled prescriptions also must necessarily increase. However, most retail pharmacies do not have the ability to expand their available square footage to accommodate a larger storage area. As a result, the will-call pick-up storage areas at many retail pharmacies have become unwieldy and inefficient.

In particular, most retail pharmacies store filled prescription orders on fixed shelves or in storage containers received on fixed bins (collectively referred to as bins herein) that are spaced apart from each other to allow a worker to walk between them to access the bins. Typically, these bins are identified and arranged by a unique alphabetic letter identifier such as "A", "B", "C", etc., and the pharmacy worker places filled prescription orders in the appropriate bin corresponding to the first letter of a customer's last name. Typically, prescription orders for different customers having the same first letter of their last name are all placed in the same bin in random order. Accordingly, a pharmacy worker must sort through all of the prescription orders in a particular bin in order to find a particular customer's order. Sometimes, a pharmacy worker may inadvertently grab and distribute the wrong prescription order from collection of prescription orders in the bin, thereby compromising the safety of the ultimate taker of the prescription drug. The likelihood of such inadvertent distribution of a filled prescription to the wrong recipient is particularly increased where customers having the same or similar names are compiled in the same location in the will-call storage area.

More recently, some pharmacies have installed fixed will-call storage racks containing a plurality of relatively small bins therein. Each bin is provided with a unique identifier such as a number, and only one prescription order is placed in each bin. Accordingly, a worker can record which bin number a particular customer's prescription order has been placed into, and retrieve this information when the customer arrives to pick-up their prescription order, thereby facilitating easy retrieval of the customers' filled order from the identified bin without having to sort through other customer's filled orders in that bin.

While these types of systems facilitate locating and retrieving a customer's prescription order, they require a large number of individually-identified bins in order for a large pharmacy to have enough storage bins to accommodate its workload. Moreover, suitable worker passage ways must also be available to allow workers to access all of the bins. In practice, an effective quantity of bins and their related passage ways require a large amount of floor space. However, many pharmacies, especially existing retail pharmacies, frequently do not have sufficient floor space to accommodate an appropriate amount of bins effectively into an existing storage area.

Moreover, as the volume of prescription orders handled by a particular pharmacy increases and the related technology that allows pharmacies to fill these orders even quicker improves, pharmacies will require even more storage space in which to effectively place filled prescription orders awaiting customer pick-up.

In addition, known will-call storage areas are usually positioned adjacent to customer pick-up areas, and the contents of bins containing a first customer's prescription order awaiting pick-up in some known will-call storage devices can sometimes be viewed by other customers when picking up their own prescription orders. Accordingly, such devices can compromise the privacy of the first customer's medical information.

SUMMARY OF THE INVENTION

Accordingly, despite the benefits of the known prescription order storage devices and systems, there remains a need for a cost effective, space saving, will-call storage system that maximizes the number of storage carriers available in a limited area, but that also allows easy identification and access to all storage carriers in the system. In addition to other benefits that will become apparent in the following disclosure, the present invention fulfills these needs.

The present invention is a storage system for a pharmacy that has a frame containing a rack-like structure with a plurality of storage carriers detachably suspended therefrom. The carriers are sized to receive filled prescription orders and the like and include individual identifiers that facilitate locating the carriers at a specific location on the rack-like structure.

A prescription order is placed into one of the storage containers and the location of that storage container in the rack-like structure is recorded by the pharmacy worker, or a pharmacy order prescription tracking system. Preferably, the rack-like structure is a plurality of horizontally aligned bars aligned vertically with respect to each other, thereby maximizing the number of storage carriers that may fit within the frame.

Customer identification and the contents of the storage carrier retaining a customer's prescription order remain concealed within the storage carrier, thereby protecting customer privacy. Moreover, since individual prescription orders are physically separated from each other for each customer, and since the unique identifiers used to track and locate a particular customer's prescription order within the system are not necessarily related to the customers' last names, the likelihood of inadvertent distribution of a filled prescription order to the wrong customer is greatly reduced.

Preferably, the storage system includes a tracking system that detects, monitors, and displays to a worker the location of the storage carrier containing a particular customer's prescription order, thereby providing easy retrieval of the customer's prescription order.

Additional objects and advantages of the present invention will be apparent from the detailed description of the preferred embodiment thereof, which proceeds with reference to the accompanying drawings.

BRIEF DESCRIPTION OF THE DRAWINGS

FIG. 1 is an isometric top left side view of a storage cabinet having a plurality of storage carriers thereon in accordance with an embodiment of the present invention.

FIG. 2 is an enlarged partial view of the rack-like structure of the storage cabinet in FIG. 1 showing a possible interaction with a storage carrier.

FIG. 4 is an enlarged, fragmentary, partial view of the rack-like structure of the storage cabinet in FIG. 3.

FIG. 5 is an enlarged, fragmentary, partial view of the rack-like structure of the storage cabinet in FIG. 3 showing a possible interaction with a storage carrier.

FIG. 6 is an enlarged partial view of an alternative embodiment of the hook portion of a storage carrier in accordance with an embodiment of the present invention.

DETAILED DESCRIPTION OF A PREFERRED EMBODIMENT

Figure 3:
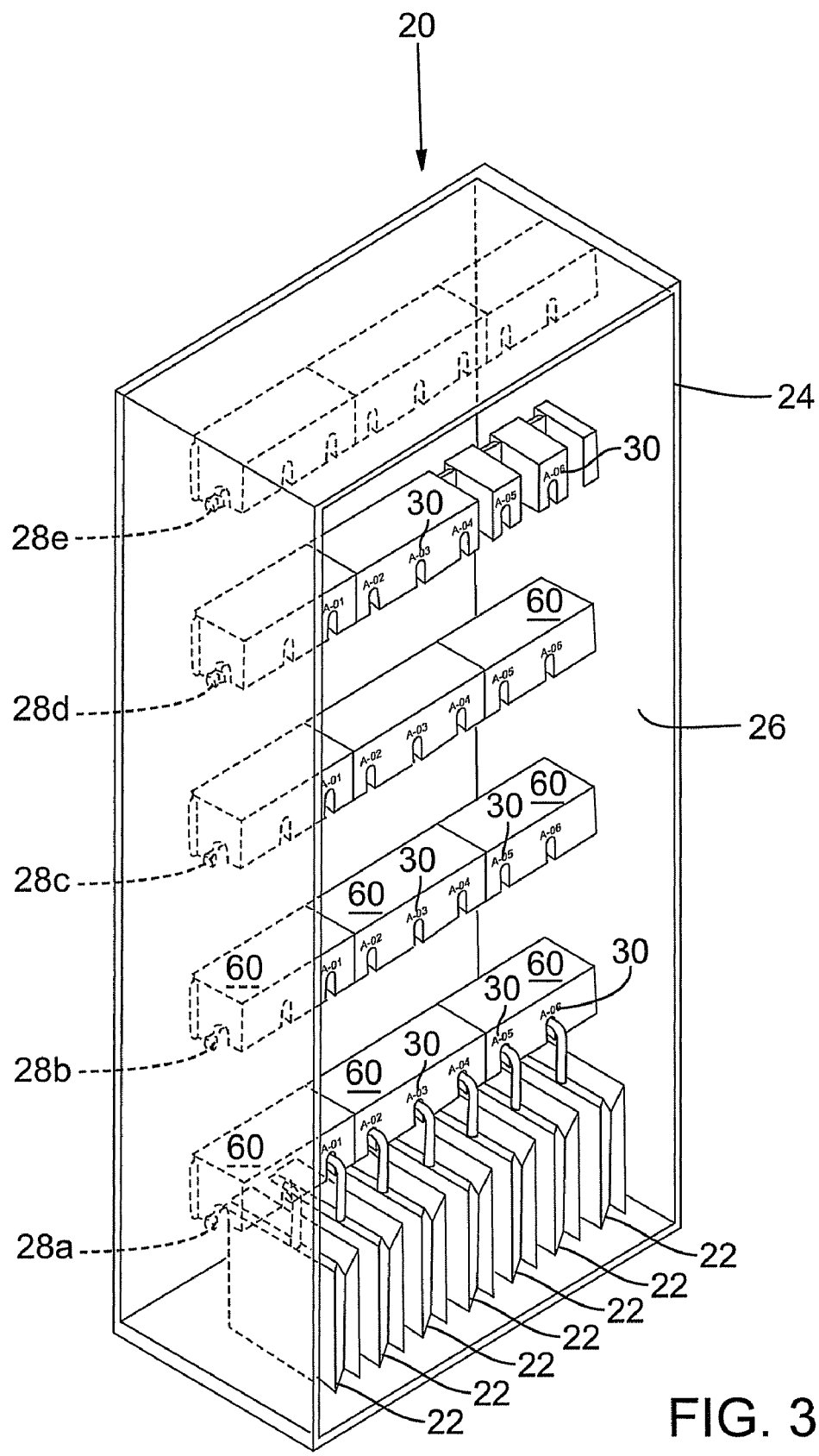
FIG. 3 is an isometric top left side view of a storage cabinet having a plurality of storage carriers thereon in accordance with an alternative embodiment of the present invention.
Figure 7:
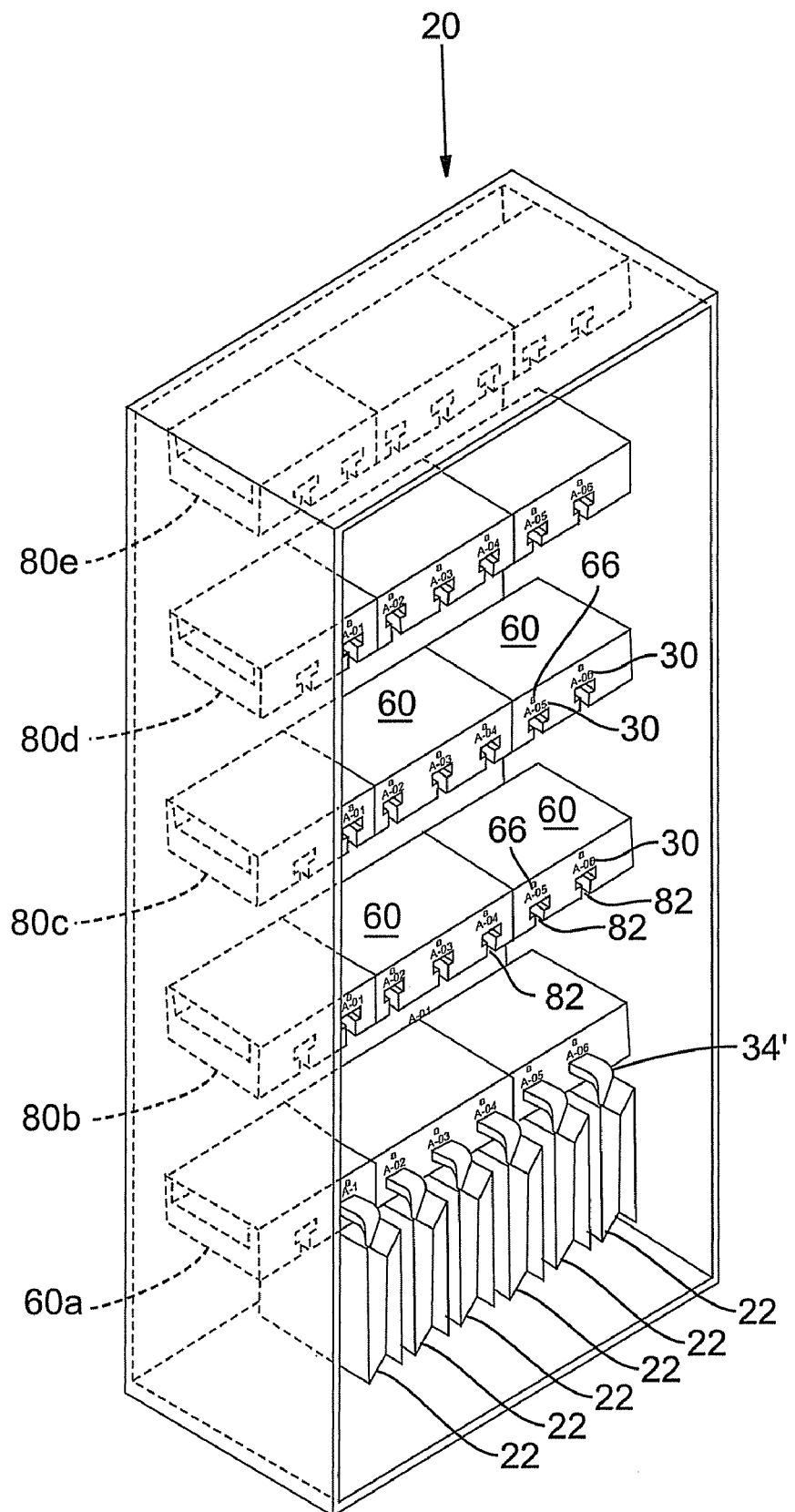
FIG. 7 is an isometric top left side view of a storage cabinet having a plurality of storage carriers thereon in accordance with a second alternative embodiment of the present invention.

A cost effective, space-saving suspended storage carrier storage device 20 that maximizes the number of storage carriers 22 available in a limited amount of floor space of a pharmacy and a related system for using the space-saving suspended storage carrier storage device 20 is shown in FIGS. 1-10.

A. Suspended Storage Carriers

As shown in FIGS. 1 & 2, the storage device 20 includes a frame, which is preferably a vertical cabinet 24 having an opening 26 on one side to provide internal access to the cabinet 24. A rack-like structure, such as the plurality of horizontally-aligned bars 28a-e positioned vertically within the cabinet 24 with respect to each other, are operably secured within the cabinet 24.

Each bar 28a-e includes identifiers 30 thereon, with each identifier 30 having a unique code that is readable by a pharmacy worker or the like. Preferably, the unique identifiers 30 are logically organized. For example, each identifier 30 includes a letter code to denote a specific rod 28a-e within the cabinet and a sequential number code to denote a logical sequence of identifiers 30 on that specific rod 28a-e.

A plurality of suspended storage carriers 22 are detachably secured to the rack-like structure. As best shown in FIG. 2, each storage carrier includes a receptacle portion 32, such as an open-ended bag, and a mounting portion 34, such as a hook 36, for detachably securing to the rack-like structure. The hook is sized to operably engage the rod 28a-e, thereby suspending the bag below the rod 28a-e.

The bag is sized and shaped to receive filled prescription orders and the like therein. More preferably, each receptacle portion 32 includes a left side 38 and right side 40 operably secured together with creased forward and aft portions 42, 44, respectfully, as shown thereby allowing the left and right sides 38, 40 to be compressed together should the contents of the receptacle portion 32 be smaller than the maximum volume of the receptacle portion 32.

Each storage carrier 22 includes a unique identifier thereon that facilitate locating the carrier at a specific location on the rack-like structure. The identifier can be a visual identifier 50 that is easily readable by a pharmacy worker or the like, and/or the identifier can be an electronic identifier 52 (FIG. 9) that is readable by a computer system.

Preferably, each unique visual identifier 50 on the storage carriers 22 corresponds with a unique visual identifier 30 on the rod 28a-e. Accordingly, a worker can easily locate the position along a rod 28a-e wherein the storage carrier 22 should be placed. More preferably, the unique visual identifiers 30, 50 on the rod and storage carriers 22 are color-coded. For example, a yellow colored storage carrier 22 is positioned adjacent to a yellow identifier 30 on the rod 28a-e and a red color storage carrier 22 is positioned adjacent to a red identifier 30 on the rod. Such color-coding provides an easy visual comparison to determine if a storage carrier 22 is properly located on the rod 28a-e.

Preferably, the mounting portion 34 of the storage carriers 22 and the visual identifiers 30 on the rod 28a-e are slidable along the rod 28a-e. Accordingly, as additional storage carriers 22 must be stored on the rod 28a-e, the storage carriers 22 already positioned on the rod 28a-e may be compressed together to make room for additional storage carriers 22 and visual identifiers 30.

Referring specifically to FIGS. 3-6, an alternative rack-like structure is disclosed within the frame 24. This structure includes a rod 28a-e operably secured to the frame 24 with detachable docking portions 60 operably received thereon as shown.

Each docking portion 60 includes one or more spaced-apart slots 62 for receiving the hook 36 of the storage carrier 22 therethrough. Adjacent to each slot 62 is a unique visual identifier 50 that is readable by a pharmacy worker or the like.

Preferably, near each slot 62 is a sensor 64 for detecting the presence of the hook 36 therein. The sensor 64 is in communication with the computer system. More preferably, transducers 66 in communication with the computer system are also secured to the docking portion 60 adjacent to each slot 62.

The sensors 64 and transducers 66 operably engage the computer system. For example, as best shown in FIG. 4, each docking portion 60 operably engages a rail 68 positioned parallel to the rod 28a. The rail 68 includes electrically conductive portions 70 that operably engage mating conductive portions on the docking portion 60, thereby operably connecting the sensors 64 and transducers 66 to the computer system. Preferably, the mounting portions 34 of the storage carriers 22 are slidably received on the rod 28a and rail 68. Accordingly, as additional storage carriers 22 must be stored on the rod 28a, the storage carriers 22 already positioned on the rod 28a and their related docking portion 60 may be compressed together to make room for additional storage carriers 22 and docking portions 60.

Referring to FIGS. 7-10, an alternative mounting portion 34' is disclosed. In this embodiment, the rack-like structure is an elongate member 80*a-e* having a plurality of substantially T-shaped slots 82 therealong. The mounting portion 34' includes a hook 36' having a T-shaped portion 84 that operably engages a T-shaped slot 82 to detachably secure each storage carrier 22 to the rack-like structure.

Figure 8:
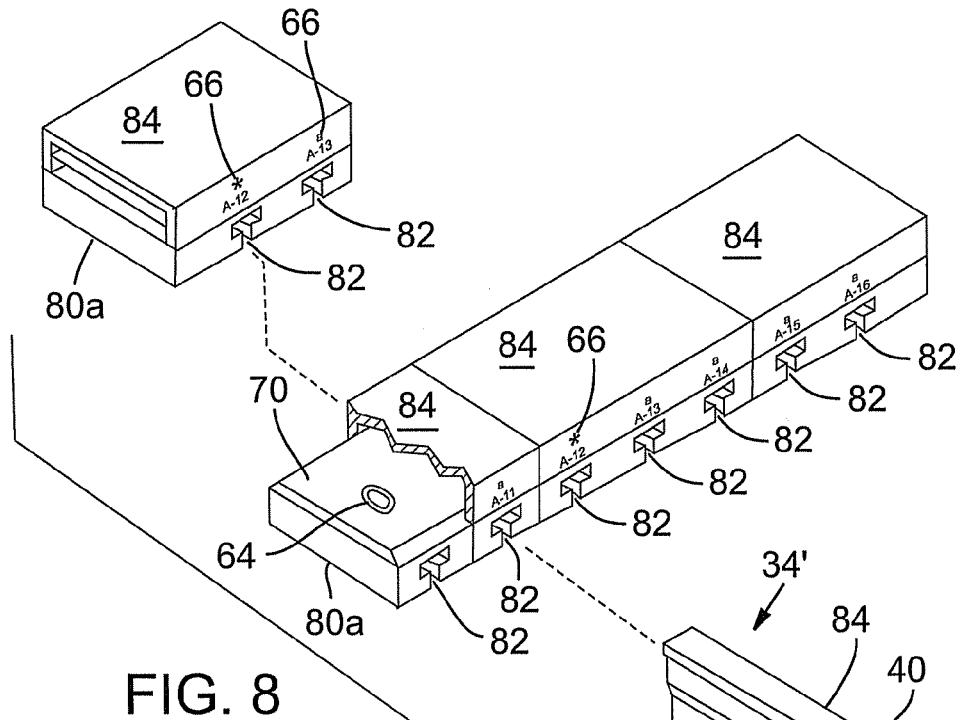
FIG. 8 is an enlarged, fragmentary, partial view of the rack-like structure of the storage cabinet in FIG. 7 showing a possible interaction with a storage carrier.
Figures 9, 10:
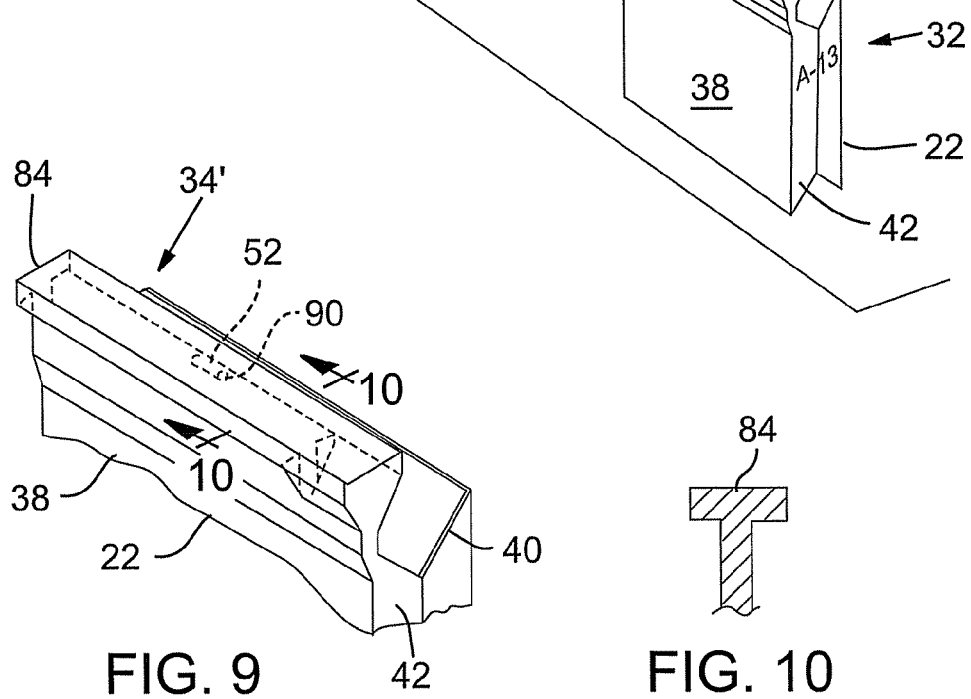
FIG. 9 is an enlarged, fragmentary view of the mounting portion of a storage carrier in accordance with an embodiment of the present invention.
FIG. 10 is a cross-sectional view of the mounting portion of the storage carrier of FIG. 9 taken along line 10-10 of FIG. 9.

Preferably, adjacent to each T-shaped slot 82 is a unique visual identifier 30 that is readable by a pharmacy worker or the like, a sensor 64 for detecting the presence of the T-shaped portion 84 therein, and a transducer 66. Preferably, the sensor 64 and transducer 66 are in communication with the computer system. For example, as best shown in FIG. 8, the rack-like structure includes electrically conductive portions 70 that operably connect the sensors 64 and transducers 66 to the computer system.

If desired, the shape of each hook 36' on each storage carrier 22 may be slightly different from the shape of other hooks 36' on other storage carriers 22 in the system. Similarly, the shape of each slot 82 for engaging the hook 36' is sized to only operably receive one particularly-shaped hook 36' therein. Accordingly, the hooks 36' essentially serve as keys that can only be received into one slot 82 in the storage device 20, thereby mechanically preventing a pharmacy worker from inadvertently placing a storage carrier 22 in the wrong location in the storage device 20.

Similarly, the hooks 36, 36' and related slots 62, 82 can include specific coding that is readable by the computer system to thereby allow the computer system to verify if the correctly identified storage carrier 22 has been placed in the correct slot 36, 36' in the storage system. If the computer system detects improper placement of a storage carrier 22, it can alert a pharmacy worker of the discrepancy, for example by activating the transducer adjacent to the slot containing the wrong storage carrier 22, or by displaying the error on a computer display within the pharmacy.

If desired, wheels or casters may be positioned below the frame 24 to allow the entire frame 24 to be moved easily within the pharmacy. In addition, the entire storage device 20 and related rack-like structure can be sized to be carried easily, thereby allowing additional storage devices 20 to rest on existing pharmacy countertops and the like, and be added and easily removed on a temporary basis as needed.

B. System for Using Suspended Storage Carrier

A pharmacy worker uses the space-saving suspended storage carrier storage device 20 for routine pharmacy storage operations and the like such as for storing filled customer prescriptions awaiting customer pick-up. In general, a pharmacy worker first locates an empty storage carrier 22, either by finding an empty storage carrier 22 already on the rack-like structure, or using an empty storage carrier 22 stored away from the rack-like structure. The pharmacy worker then places the filled prescription in the storage carrier 22 and records the unique identifier 50, 52 associated with that storage carrier 22. The worker then places the storage carrier 22 containing the filled prescription onto the rack-like structure adjacent to a visual identifier 30 on the rack-like structure. In cases where there is no electronic tracking of the storage carrier, the worker places the storage carrier on the rack-like structure at the location of the visual identifier 30 corresponding with the matching unique code found on the visual identifier 50 on the storage carrier 22.

When a customer returns to pickup his or her order, the pharmacy worker consults the information that coordinates that particular customer with the visual identifier 30 on the rack-like structure associated with the location of the storage container 22 in which his or her prescription is residing. The worker then goes to that particular location on the rack-like structure and removes the storage carrier 22 from that location. He or she then removes the filled prescription from that storage carrier 22 and hands it to the customer. Since individual prescription orders are physically separated from each other for each customer, and since the unique identifiers used to track and locate a particular customer's prescription order within the system are not necessarily related to the customers' last names, the likelihood of inadvertent distribution of a filled prescription order to the wrong customer is greatly reduced.

It can be appreciated that these steps may be performed purely manually, or with the assistance of a suitable electronics to facilitate these tracking and data compilation and retrieval tasks. In particular, a customer's prescription order and/or the storage carrier 22 in which it is placed can include a uniquely coded tag 90 (FIGS. 6 & 9), such as a bar code or a more sophisticated tracking device, such as a radio-frequency identification tag that is part of a system that locates objects through electromagnetic interrogation of a spatial region to determine the presence of the tag. The tag 90 travels with the prescription order and/or the storage carrier 22 throughout the pharmacy and is readable by appropriate sensors 64 in communication with the computer system. The computer system compiles and maintains a database that correlates a particular customer with a particular uniquely coded tag 90.

Such tags 90 and their related sensors 64 are generally well understood. An exemplar bar code tag and related reader may be found in U.S. Pat. No. 4,210,802 to Sakai, the disclosure of which is hereby incorporated by reference. Similarly, an electromagnetic interrogation tag system may be found in U.S. Pat. No. 6,057,756 to Engellenner, the disclosure of which is hereby incorporated by reference.

Similarly, each location in the rack-like structure of the space-saving storage device can include appropriate sensors 90 to detect the presence of a tag 90, which is operably secured to the mounting portion 34, 34' of the storage carrier 22 as shown in FIGS. 5 & 8. The sensors 90 are in communication with the computer system, which uses this location detection information and correlates it with the customer information associated with the filled prescription order contained in the storage carrier 22. This correlation usually includes correlating the visual identifier 30 of the slot 62, 82 in the rack-like structure with the customer information. Preferably, the computer system includes an interface, such as a monitor and keyboard, for allowing a pharmacy worker to access and display this information.

Accordingly, when a customer returns to pick-up their prescription, the pharmacy worker may access the computer system to determine the visual identifier 30 associated with the particular location on the rack-like structure holding the storage carrier 22 containing that particular customer's order. He or she then simply removes the storage carrier 22 adjacent to that visual identifier 30 on the rack-like structure and opens the storage carrier 22 to remove the customer's order.

It can be appreciated that the computer system can associate the tag 90 installed on the storage carrier 22 with the customer's order. Accordingly, in such cases, the worker need not necessarily position or correlate the visual identifier 50 on the storage carrier 22 with the visual identifier 30 on the rack-like structure. The computer system can automatically correlate the location of the customer's prescription order on the rack-like structure with the customer information simply by the worker inserting the mounting portion 34, 34' of the storage carrier 22 into any available slot 62, 82 on the rack-like structure.

Preferably and as best shown in FIGS. 4, 5, and 8 each location for securing the hook 36, 36' of the storage carrier 22 includes at least one transducer 66, such as one or more lights or speakers thereon. The transducers 66 are independently operable and in communication with the computer system. Accordingly, the computer system can command the transducers 66 based on predefined criteria. For example, if a pharmacy worker enters into the computer system a particular customer's name, the computer system can not only display the correct location identifier 30 on the rack-like structure below which to find the storage carrier 22 containing the customer's prescription order, it can also illuminate a light adjacent to that particular storage carrier 22 to facilitate finding it in the system.

Similarly, the computer system can detect and illuminate lights adjacent to empty storage carriers 22 that are available to receive new prescription orders. Also, the computer system can include a timing element used to track when filled prescriptions within storage carriers 22 that have remained in a particular storage carrier 22 on the rack-like structure beyond a predetermined time. The computer system can then flag such overdue pickups to a pharmacy worker by displaying such information on the monitor and/or activating the transducers 66 adjacent to the storage carriers containing the overdue prescription orders.

Preferably, the transducers 90 can send different signals to a pharmacy worker. For example, empty storage carriers 22 can be identified with a green light, storage carriers 22 containing filled prescription orders that are overdue for pickup can be identified with a red light, and a particular storage carrier 22 containing a particularly flagged customer's order can be identified by a flashing yellow light.

As an additional safety measure the computer system can also detect when a storage carrier 22 containing a particular customer prescription order has been removed from the rack-like structure. Accordingly, the computer system can correlate the identification of a current customer transaction, such as a current pharmacy prescription payment transaction or pharmacy worker input of that customer's name into the computer identification and tracking system to determine the location in the storage cabinet of that customer's prescription order, and signal the pharmacy worker if the wrong storage carrier 22 has been removed from the storage cabinet. Such signaling can include displaying the discrepancy on the computer display and/or activating one or more transducers such as flashing lights and audible alarms near the improperly removed storage carrier 22.

In accordance with the practices of persons skilled in the art of computer programming, the present invention is described above with reference to acts and symbolic representations of operations that are performed by various computer systems. Such acts and operations are sometimes referred to as being computer-executed and may be associated with the operating system or the application program as appropriate. It will be appreciated that the acts and symbolically represented operations include the manipulation by a CPU of electrical signals representing data bits, which causes a resulting transformation or reduction of the electrical signal representation, and the maintenance of data bits at memory locations in a memory system to thereby reconfigure or otherwise alter the computer system operation, as well as other processing of signals. The memory locations where data bits are maintained are physical locations that have particular electrical, magnetic, or optical properties corresponding to the data bits.

In view of the wide variety of embodiments to which the principles of the invention can be applied, it should be apparent that the detailed embodiments are illustrative only and should not be taken as limiting the scope of the invention. Rather, the claimed invention includes all such modifications as may come within the scope of the following claims and equivalents thereto.

What is claimed is:

1. A storage device for use in a pharmacy, said storage device including:
   a frame;
   a rack-like structure operably secured to the frame, said rack-like structure having defined locations thereon with each location denoted by a visual identifier;
   a storage carrier detachably secured to one of said defined locations on said rack-like structure, said storage carrier having a mounting portion for being detachably secured to the rack-like structure and a receptacle portion, said storage carrier having a unique carrier identifier that corresponds with the visual identifier at said one of said defined locations on the rack-like structure;
   said one of said defined locations selected by a pharmacy worker-operably securing said mounting portion of said storage carrier to one of said defined locations to define a worker selected location, said one of said defined locations chosen by the pharmacy worker from any available location of said defined locations;
   a filled prescription order manually received within said receptacle portion of said carrier by the pharmacy worker; said filled prescription order containing a unique prescription order and associated with a customer of the pharmacy; and,
   computer means for automatically detecting and correlating said customer with the visual identifier at said selected location on the rack-like structure when the worker positions the storage carrier at the worker selected location on the rack-like structure thereby allowing the location of the storage carrier containing said filled prescription order to be determined.

2. The storage device for use in a pharmacy of claim 1, wherein said receptacle portion is compressible to thereby minimize the size of the storage carrier when installed on the rack-like structure.

3. The storage device for use in a pharmacy of claim 2, wherein said receptacle portion has a left side, a right side and creased front and rear sides extending therebetween, thereby allowing said receptacle portion to be compressible.

4. The storage device for use in a pharmacy of claim 1, wherein said rack-like structure includes a plurality of horizontal rods spaced vertically apart from each other.

5. The storage device for use in a pharmacy of claim 1, wherein said rack-like structure includes a rod, and said mounting portion has a hook that operably engages said rod.

6. The storage device for use in a pharmacy of claim 5, wherein said hook and said visual identifier is slidable along said rod, thereby allowing a plurality of storage containers secured to said rod and compressed on said rod.

7. The storage device for use in a pharmacy of claim 1, wherein said rack-like structure includes a plurality of spaced-apart slots, and said mounting portion includes a hook that operably engages said slots.

8. The storage device for use in a pharmacy of claim 7, wherein said hook, said slots, and said visual identifiers are slidable along said rack-like structure.

9. The storage device for storing prescription orders in a pharmacy of claim 7 wherein said hook has a t-shaped cross section, and said slot operably engages said hook to hold said storage carrier on said rack-like structure.

10. The storage device for use in a pharmacy of claim 1, wherein said carrier identifier is computer readable, and further including:
   a computer system having sensors for detecting the presence of said carrier identifier adjacent to a visual identifier at the worker selected location on the rack-like structure such that the location of said storage carrier on said rack-like structure is detected by said computer system and provided to a pharmacy worker.

11. The storage device for use in a pharmacy of claim 10, wherein said carrier identifier is a unique bar code, and said sensor is a bar code reader in communication with the computer system.

12. The storage device for use in a pharmacy of claim 10, wherein said carrier identifier is a radio-frequency identification tag, and said sensor is a radio-frequency identification tag reader in communication with the computer system.

13. The storage device for use in a pharmacy of claim 10, wherein the computer system correlates a customer's information with the visual identifier at the location on the rack-like structure of the storage carrier containing said customer's filled prescription order and displays this information to a pharmacy worker.

14. The storage device for use in a pharmacy of claim 13, wherein said computer system detects a particular customer, and said computer system alerts the pharmacy worker when a storage carrier is removed from said rack-like structure and said customer information corresponding with the filled prescription order contained in said storage carrier fails to correlate with said particular customer.

15. The storage device for use in a pharmacy of claim 13, further including a transducer in communication with the computer system, said transducer operable by the computer system to alert a pharmacy worker based on a predetermined criteria.

16. The storage device for use in a pharmacy of claim 15, wherein said computer system detects a particular customer, and said predetermined criteria includes operating said transducer when a storage carrier is removed from said rack-like structure and said customer information corresponding with the filled prescription order contained in said storage carrier fails to correlate with said particular customer.

17. The storage device for use in a pharmacy of claim 15, wherein said transducer is a light positioned adjacent to said visual identifier on said rack-like structure.

18. A storage system for use in a pharmacy, said storage system including:
   a computer system; and,
   a storage device in communication with said computer system, said storage device having:
   a frame;
   a rack-like structure operably secured to the frame, said rack-like structure having defined locations thereon with each location denoted by a unique identifier;
   a storage carrier detachably secured to one of said defined locations on said rack-like structure, said storage carrier having a mounting portion for being detachably secured to the rack-like structure and a receptacle portion, said one of said defined locations selected by a pharmacy worker from any available location of said defined locations by the pharmacy worker detachably securing said mounting portion to one location of said defined locations to define a worker selected location;
   a filled prescription order received manually within said receptacle portion of said carrier; said filled prescription order associated with a customer of the pharmacy;
   a computer readable identification tag secured to the mounting portion of said storage carrier, said tag having a unique tag identifier associated with the storage carrier;
   a tag reader in communication with the computer system, said tag reader reads said computer readable identification tag when said mounting portion is positioned on said rack-like structure;
   wherein the tag reader detects and the computer system automatically correlates the filled prescription order with the unique identifier associated with the selected location near which the storage carrier is manually placed, thereby facilitating the location and retrieval of the customer's filled prescription order from the worker selected location in the storage device.

19. The storage system for use in a pharmacy of claim 18, wherein said computer readable tag is a radio-frequency identification tag and said tag reader is a radio-frequency identification reader.

20. The storage system for use in a pharmacy of claim 18, wherein said receptacle portion is compressible to thereby minimize the size of the carrier portion when installed on the rack-like structure.

21. The storage system for use in a pharmacy of claim 18, wherein said receptacle portion has a left side, a right side and creased front and rear sides extending therebetween, thereby allowing said receptacle portion to be compressible.

22. The storage system for use in a pharmacy of claim 18, further including a transducer in communication with the computer system, said transducer operable by the computer system to alert a pharmacy worker based on a predetermined criteria.

23. The storage system for use in a pharmacy of claim 22, wherein said transducer is operably secure to said rack-like structure.

24. The storage system for use in a pharmacy of claim 18, wherein said mounting portion is a hook.

25. The storage system for use in a pharmacy of claim 18, wherein said tag reader is positioned adjacent a defined location on said rack like structure.

26. The storage system for use in a pharmacy of claim 18, wherein said computer system detects when a storage container is removed from the rack-like structure to define a removed storage container and verifies that the filled prescription within the removed storage container is associated with the customer.

27. The storage system for use in a pharmacy of claim 23, further including a transducer operably secured to the storage system and in communication with the computer system, said transducer is activated when said computer system determines that the filled prescription in the removed storage carrier is not associated with the customer, thereby alerting a pharmacy worker that an incorrect storage container has been removed from the rack-like structure.

* * * * *